United States Patent
Kim et al.

(10) Patent No.: US 7,574,467 B2
(45) Date of Patent: Aug. 11, 2009

(54) ADAPTIVE EQUALIZER AND METHOD FOR THE SAME

(75) Inventors: Do-han Kim, Suwon-si (KR); Hyun-bae Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 815 days.

(21) Appl. No.: 11/128,230

(22) Filed: May 13, 2005

(65) Prior Publication Data

US 2006/0089957 A1 Apr. 27, 2006

(30) Foreign Application Priority Data

Oct. 23, 2004 (KR) .................... 10-2004-0085089

(51) Int. Cl.
*G06F 17/10* (2006.01)
(52) U.S. Cl. ..................................... 708/323
(58) Field of Classification Search ................. 708/323, 708/322

See application file for complete search history.

(56) References Cited

U.S. PATENT DOCUMENTS

| | | | |
|---|---|---|---|
| 5,768,313 A * | 6/1998 | Kuribayashi | 375/232 |
| 5,777,910 A | 7/1998 | Lu | |
| 6,151,614 A * | 11/2000 | Ikeda | 708/322 |
| 6,385,239 B1 | 5/2002 | Okamoto et al. | |
| 6,744,886 B1 * | 6/2004 | Benesty et al. | 379/406.08 |
| 6,879,630 B2 * | 4/2005 | Kokuryo et al. | 375/231 |
| 2001/0043651 A1 * | 11/2001 | Nishimura et al. | 375/232 |
| 2003/0084079 A1 * | 5/2003 | Awad et al. | 708/322 |
| 2004/0101075 A1 * | 5/2004 | Kim et al. | 375/350 |

* cited by examiner

*Primary Examiner*—David H Malzahn
(74) *Attorney, Agent, or Firm*—Harness, Dickey & Pierce, P.L.C.

(57) ABSTRACT

An equalizer may include, filter an input data signal based on a plurality of filtering coefficients, and outputs an output data signal, determine whether filtering coefficients satisfy a condition in response to a bit selection signal, and output the filtering control signals based on the determination result, and generate the filtering coefficients, estimate channels based on the input data signal and update the filtering coefficients based on the estimation results.

29 Claims, 7 Drawing Sheets

ADAPTIVE EQUALIZER AND METHOD FOR THE SAME

This application claims priority under 35 U.S.C. §119 to of Korean Patent Application No. 10-2004-0085089, filed on Oct. 23, 2004, in the Korean Intellectual Property Office, the contents of which are incorporated herein in its entirety by reference.

BACKGROUND OF THE INVENTION

1. Field of the Invention

Example embodiments of the present invention relate to equalizers and methods for channel equalization.

2. Description of the Conventional Art

Equalizers may be used to compensate for distortion of signals input to, or output from, various types of signal transmission and/or receipt systems. Equalizers may include a filtering circuit, which may improve performance of a communications system, for example, by suppressing channel noise and/or distortion. Channel noise and/or distortion may be caused by delay of signals input to, or output from, a communications system, for example, via multiple paths. The filtering circuit may use filtering coefficients in order to suppress channel noise and/or channel distortion. The values of the filtering coefficients may be determined based on channel estimation information and/or noise signals distributed over upper and/or lower frequencies of main data signals, (e.g., delayed signals). Filtering coefficients corresponding to noise signals may be set to values such that respective noise signals may be suppressed.

FIG. 1 is a block diagram illustrating an example a conventional equalizer 10. Referring to FIG. 1, the conventional equalizer 10 may include a filtering circuit 11 and a coefficient updating circuit 12. The filtering circuit 11 may include a plurality of filter cells TS1 through TSM (where M is an integer) and an adder 16. Each of the filter cells TS1 through TSM may include a data buffer 13, a coefficient buffer 14, and a multiplier 15. The data buffer 13 for each of the filter cells TS1 through TSM and the coefficient updating circuit 12 may receive an input data signal Din. The coefficient updating circuit 12 may estimate channels, which may vary with respect to the input data signal Din, and may generate filtering coefficients Co1 through CoM (where M is an integer) based on the estimated channels.

For example, if the filtering circuit 11 includes 9 filter cells, the input data signal Din, and the filtering coefficients Co1 through Co9, the multiplication signals X1 through X9 obtained using the 9 filter cells may be illustrated in FIG. 2. Referring to FIG. 2, the input data signal Din may include main data signals MS1 and MS2 and noise signals Eo1 through Eo4. The noise signals Eo1 through Eo4 may be, for example, delayed main data signals MS1 and MS2, which may be generated when transmitting the main data signals MS1 and MS2, for example, via multiple paths. In order to suppress the noise signals Eo1 through Eo4, the coefficient updating circuit 12 may generate the filtering coefficients Co1, Co2, Co4, and Co7, which may offset the noise signals Eo1 through Eo4, respectively. The multipliers 15s may suppress the noise signals Eo1 through Eo4 by multiplying the noise signals Eo1 through Eo4 by the filtering coefficients Co1, Co2, Co4, and Co7, respectively. The multiplication signals X1, X2, X4, and X7, may have values of, for example, zero, as shown in FIG. 2.

In order to output the main data signals MS1 and MS2 properly (e.g., unchanged), as the multiplication signals X5 and X9, respectively, the coefficient updating circuit 12 may generate filtering coefficients Co5 and Co9 such that the multiplication signals X5 and X9 obtained by multiplying the main data signals MS1 and MS2 by the filtering coefficients Co5 and Co9, respectively, may have the same, or substantially the same, values as the main data signals MS1 and MS2.

Less precise channel estimation may cause filtering coefficients Co3, Co6, and Co6 whose values may be substantially zero, but may not be equal to zero, to be generated by the coefficient updating circuit 12. The multiplication signals X3, X6, and X8, obtained by multiplying the main data signals or noise signals by the filtering coefficients Co3, Co6, and Co6, respectively, may be input to the adder 16 such that a distorted version of the input data signal Din may be output as an output data signal Dout.

SUMMARY OF THE INVENTION

Example embodiments of the present invention provide an equalizer (e.g., a sparse tap adaptive equalizer), which may reduce filtered signal distortion by selectively enabling coefficient buffers based on the values of filtering coefficients and/or may reduce chip size by determining the values of the filtering coefficients, for example, without the use of a comparator.

An example embodiment of the present invention provides an equalizer, which may include a filtering circuit, a filter control circuit and a coefficient updating circuit. The filtering circuit may filter an input data signal based on a plurality of filtering coefficients and may output an output data signal. The filter control circuit may determine whether the filtering coefficients satisfy a condition in response to a bit selection signal and may output control signals based on the determination. The coefficient updating circuit may generate the filtering coefficients, estimate channels based on the input data signal, and update the filtering coefficients based on the estimated channels.

Another example embodiment of the present invention provides a filter control circuit, which may include a plurality of coefficient determination circuits. Each of the coefficient determination circuits may selectively enable and disable a corresponding control signal based on a comparison between filtering coefficients stored in a corresponding coefficient buffer and a threshold value.

Another example embodiment of the present invention provides a channel equalization method. An example embodiment of the method may include filtering an input data signal based on a plurality of filtering coefficients, and outputting an output data signal; determining whether the filtering coefficients satisfy a condition in response to a bit selection signal and outputting control signals based on the determination; and generating the filtering coefficients, estimating channels based on the input data signal and updating the filtering coefficients based on the estimated channels.

In example embodiments of the present invention, the filtering circuit may include a plurality of filter banks. The filter bank may further include a plurality of filter cells, wherein each of the filter cells may include a coefficient buffer that is enabled or disabled in response to one of the control signals and stores one of the filtering coefficients when enabled.

In example embodiments of the present invention, each of the filtering coefficients may include (I+1) bits where I is an integer, the bit selection signal may include first through I-th selection signals, and one of the first through I-th selection signals may be enabled based on a threshold value.

In example embodiments of the present invention, the filter control circuit may include at least one bank control circuit. The bank control circuit may further include a plurality of coefficient determination circuits, wherein each of the coefficient determination circuits may selectively enable and disable a corresponding control signal based on a comparison between filtering coefficients stored in a corresponding coefficient buffer and a threshold value.

In example embodiments of the present invention, each of the coefficient buffers may be selectively enabled when respective control signals are enabled and may be disabled when the respective control signals are disabled.

In example embodiments of the present invention, each of the coefficient determination circuits may perform a logic operation on at least one of (I+1) bits of at least one corresponding filtering coefficient stored in at least one corresponding coefficient buffer in response to at least one of a first through I-th selection signals. The at least one logic operation result may be output as a corresponding control signal.

In example embodiments of the present invention, the threshold value may include one bit which may be set to 2T where T=0, 1, . . . , I−1. As the threshold value increases, the number of bits of each of the filtering coefficients, which may be subjected to the logic operation performed by each of the coefficient determination circuits may decrease.

In example embodiments of the present invention, if the threshold value is at a maximum, the I-th selection signal may be enabled, and each of the coefficient determination circuits may perform the logic operation on the two most significant bits of the corresponding filtering coefficient in response to the I-th selection signal. The logic operation result may be output as the control signal.

In example embodiments of the present invention, if the threshold value is set to a minimum, the first selection signal may be enabled, and each of the coefficient determination circuits may perform the logic operation on all, or substantially all, of the I+1 bits of the corresponding filtering coefficient in response to the first selection signal. The logic operation result may be output as the corresponding control signal. In example embodiments of the present invention, the logic operation may be an OR operation.

In example embodiments of the present invention, each of the coefficient determination circuits may further include first through I-th selectors and a multiplexer. The first through I-th selectors may output first through I-th logic signals, respectively, in response to the (I+1) bits of the corresponding filtering coefficient. The multiplexer may select one of the first through I-th logic signals in response to one of the first through I-th selection signals that may be enabled and may output the selected logic signal as one of the control signals. In example embodiments of the present invention, the first selector may perform an OR operation on the two most significant bits of the corresponding filtering coefficient and may output the first logic signal. The I-th selector may perform an OR operation on the least significant bit of the corresponding filtering coefficient and the (I−1)-th logic signal and may output the I-th logic signal.

In example embodiments of the present invention, the second through I-th selectors may receive the first through (I−1)-th logic signals, respectively, via first input ports, and may receive the (I+1) bits of the corresponding filtering coefficient excluding the two most significant bits via second input ports.

In example embodiments of the present invention, the filtering circuit may include a plurality of filter banks. Each of the plurality of filter banks may further include a plurality of filter cells, each of which may include a coefficient buffer. Each of the coefficient buffers may be enabled or disabled in response to one of the plurality of control signals and may store one of the filtering coefficients when enabled. The coefficient buffers may be enabled or disabled in response to one of the control signals.

In example embodiments of the present invention, the filter control circuit may further include a plurality of filter banks and a plurality of bank control circuits. Each of the bank control circuits may selectively enable and disable a corresponding control signal based on a comparison between at least one of the filtering coefficients stored in the coefficient buffers of a corresponding filter bank and a threshold value.

In example embodiments of the present invention, the filter control circuit may further include a plurality of filter banks and a plurality of bank control circuits. Each of the bank control circuits may perform a logic operation on at least one of the (I+1) bits of each of the corresponding filtering coefficients stored in the coefficient buffers of a corresponding filter bank. The logic operation results may be output as a corresponding control signal.

In example embodiments of the present invention, if the threshold value is set to a maximum, the I-th selection signal may be enabled, and each of the bank control circuits may perform the logic operation on the two most significant bits of each of the filtering coefficients, received from the corresponding filter bank, in response to the I-th selection signal. The logic operation results may be output as the corresponding control signal.

In example embodiments of the present invention, if the threshold value is set to a minimum, the first selection signal may be enabled, and each of the coefficient determination circuits may perform the logic operation on the (I+1) bits of each of the filtering coefficients, received from the corresponding filter bank, in response to the first selection signal. The logic operation results may be output as a corresponding control signal. In example embodiments of the present invention, the logic operation may be an OR operation.

In example embodiments of the present invention, each of the bank control circuits may include pre-selectors and a coefficient determination circuit. The pre-selectors may output first through (I+1)-th operation signals in response to the (I+1) bits of each of the filtering coefficients received from a corresponding filter bank. The coefficient determination circuit may generate a corresponding control signal in response to a bit selection signal and the first through (I+1)-th operation signals.

In example embodiments of the present invention, each of the pre-selectors may perform an OR operation on one of the (I+1) bits of each of the filtering coefficients received from a corresponding filter bank.

In example embodiments of the present invention, the coefficient determination circuit may include first through I-th selectors and multiplexer. The first through I-th selectors may output first through I-th logic signals in response to the first through (I+1)-th operation signals. The multiplexer may select one of the first through I-th logic signals in response to one of the first through I-th selection signals, which may be enabled, and may output the selected logic signal as the corresponding bank control signal. The first selector may perform an OR operation on the first and second operation signals and may output the first logic signal; the I-th selector may perform an OR operation on the (I+1)-th operation signal and the (I−1)-th logic signal and may output the I-th logic signal.

In example embodiments of the present invention, the second through I-th selectors may receive the first through (I−1)-th logic signals via first input ports, and may receive the third through (I+1)-th operation signals via second input ports.

BRIEF DESCRIPTION OF THE DRAWINGS

Example embodiments of the present invention will now be described in detail with reference to the attached drawings in which.

DETAILED DESCRIPTION OF THE EXAMPLE EMBODIMENTS OF THE PRESENT INVENTION

Figure 1:
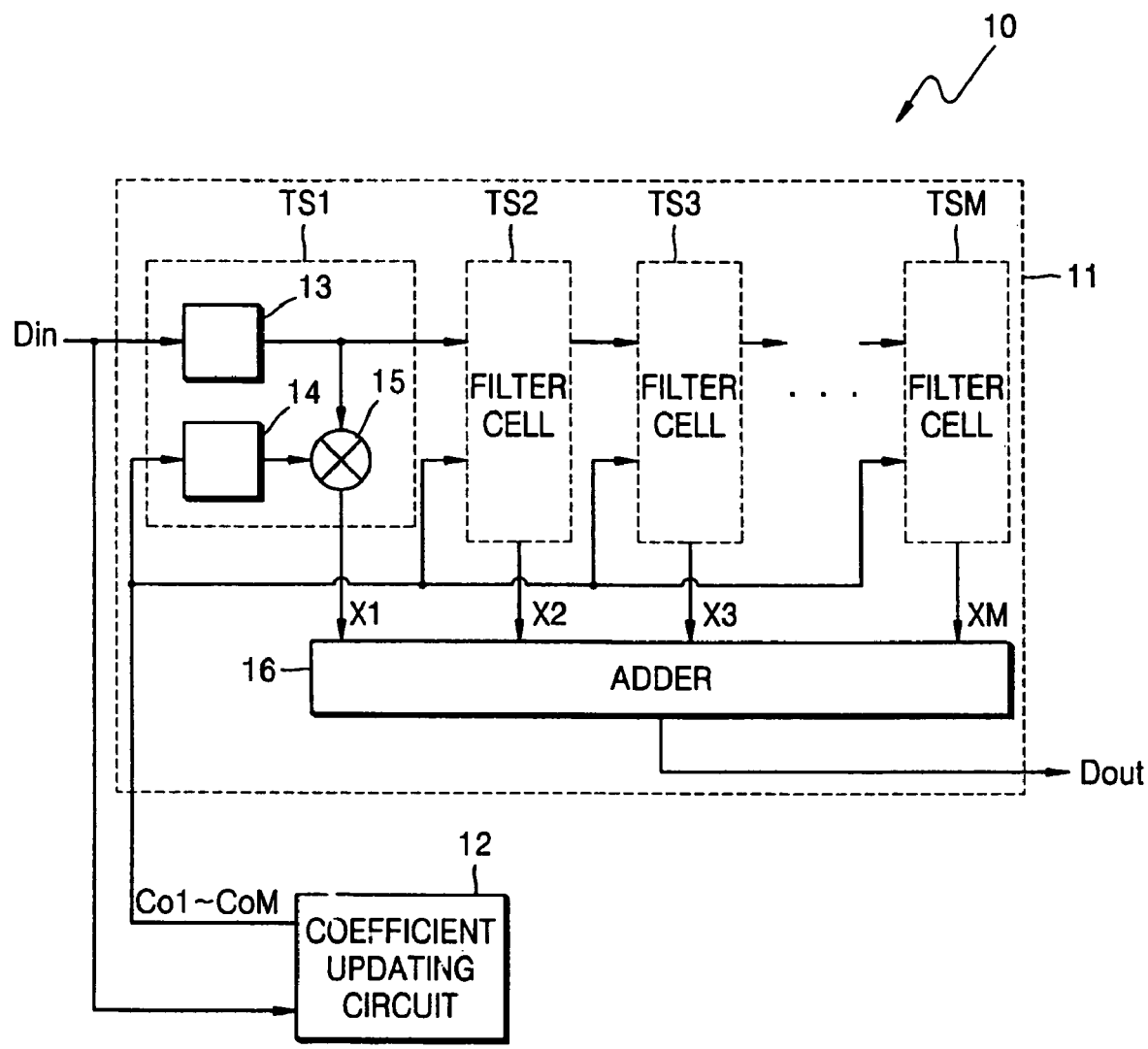
FIG. 1 is a block diagram of a conventional equalizer.
Figure 2:
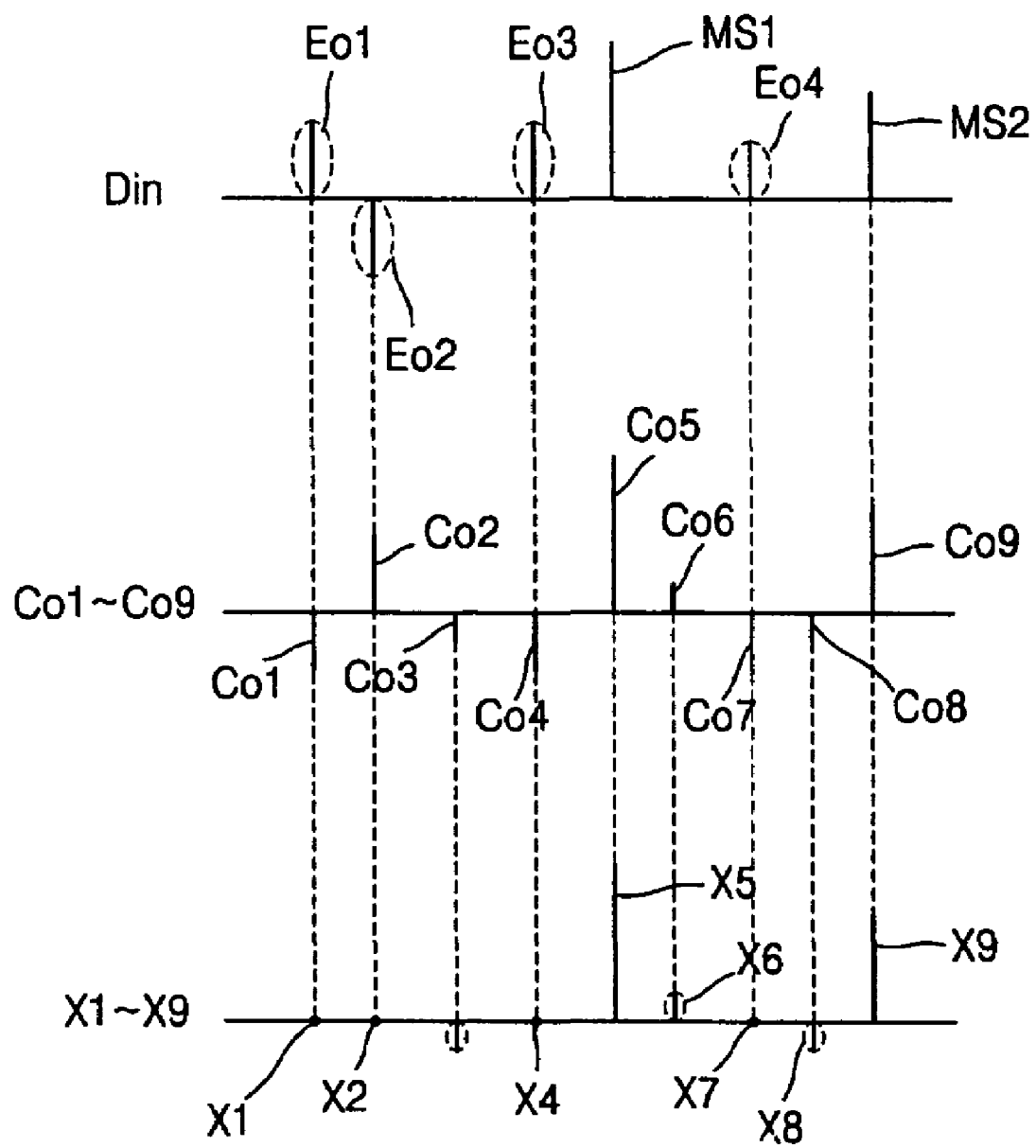
FIG. 2 is a diagram illustrating signals related to the operation of a conventional equalizer.

Example embodiments of the present invention will now be described more fully with reference to the accompanying drawings in which example embodiments of the present invention are shown. In the drawings, like reference numerals represent like elements.

Figure 3:
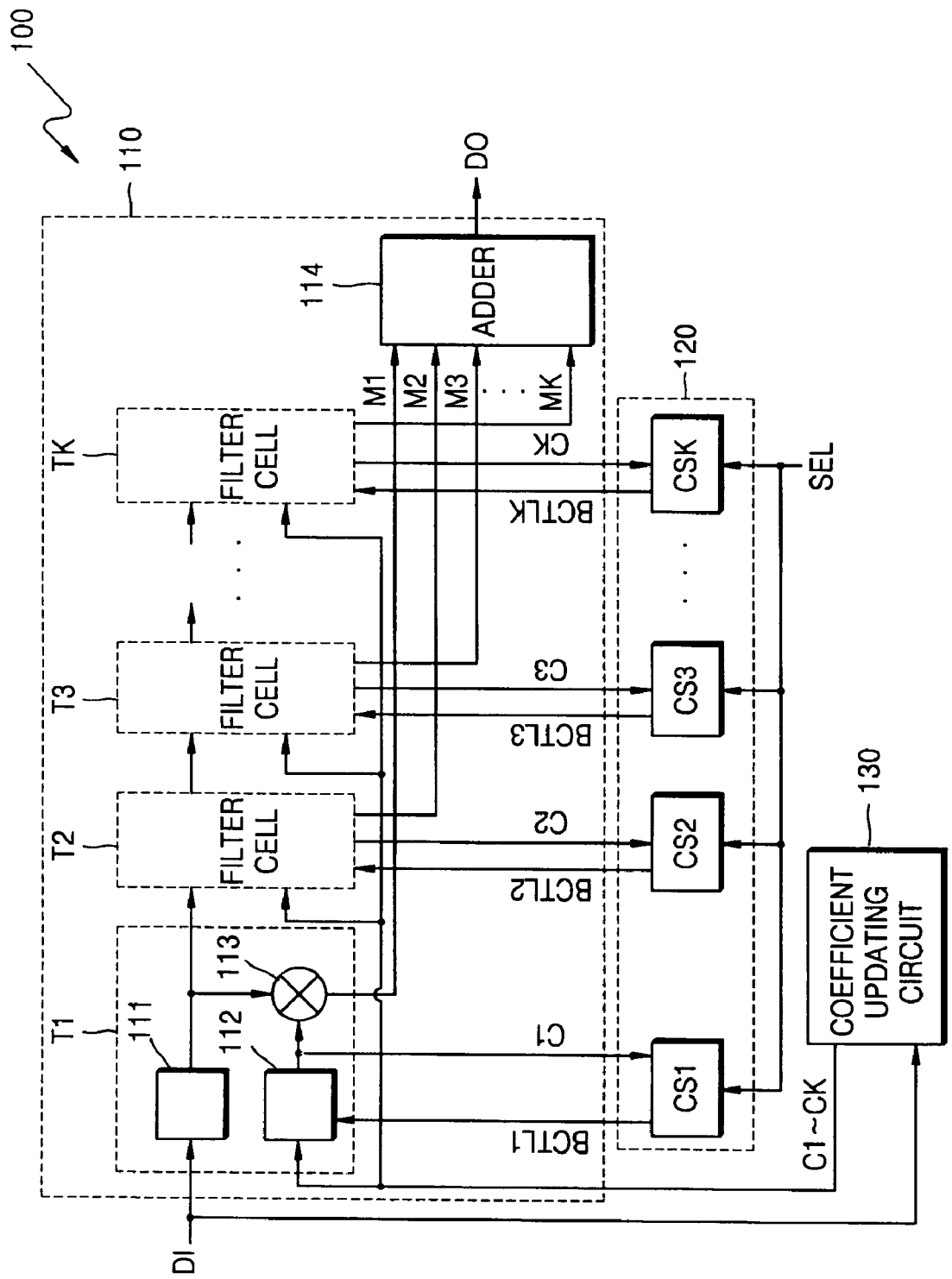
FIG. 3 is a block diagram of an equalizer, according to an example embodiment of the present invention.

FIG. 3 is a block diagram of an equalizer 100 according to an example embodiment of the present invention. Referring to FIG. 3, the equalizer 100 may include a filtering circuit 110, a filter control circuit 120, and a coefficient updating circuit 130. The filtering circuit 110 may include a plurality of filter cells (e.g., taps) T1 through TK (where K is an integer) and an adder 114. Each of the filter cells T1 through TK may include a data buffer 111, a coefficient buffer 112, and a multiplier 113. The filter cells T1 through TK may receive and store (e.g., sequentially receive and sequentially store) an input data signal DI. The coefficient buffers 112 of the filter cells T1 through TK may be selectively enabled or disabled in response to filtering control signals BCTL1 through BCTLK (where K is an integer), respectively. When the filtering control signals BCTL1 through BCTLK are enabled, the coefficient buffers 112 of the filter cells T1 through TK may be enabled, and the coefficient buffers 112 of the filter cells T1 through TK may store filtering coefficients C1 through CK (where K is an integer), respectively. The number of bits, which may constitute each of the filtering coefficients C1 through CK may be the same, or substantially the same, as the number of bits of data (not shown) stored in each of the data buffers 111. The multipliers 113 of the filter cells T1 through TK may multiply the input data signal DI by the filtering coefficients C1 through CK, respectively, and may output multiplication signals M1 through MK. The adder 114 may add the multiplication signals M1 through MK and may output an output data signal DO.

The filter control circuit 120 may include a plurality of coefficient determination circuits CS1 through CSK (where K is an integer). The coefficient determination circuits CS1 through CSK may determine whether the filtering coefficients C1 through CK, received from the respective coefficient buffers 112, are less than a threshold value and may output filtering control signals BCTL1 through BCTLK based on the result. For example, if the filtering coefficients C1 through CK are greater than or equal to the threshold value, the coefficient determination circuits CS1 through CSK may enable the filtering control signals BCTL1 through BCTLK, respectively. If the filtering coefficients C1 through CK are less than the threshold value, coefficient determination circuits CS1 through CSK may disable the filtering control signals BCTL1 through BCTLK, respectively.

For example, if the filtering coefficients C1 through C3, C5 through C7, and C9 through CK are less than the threshold value, and the filtering coefficients C4 and C8 are greater than the threshold value, then the filter control circuit 120 may disable the filtering control signals BCTL1 through BCTL3, BCTL5 through BCTL7, and BCTL9 through BCTLK, and may enable the filtering control signals BCTL4 and BCTL8. The coefficient buffers 112 of the filter cells T4 and T8 may be enabled, and the coefficient buffers 112 of the filter cells T1 through T3, T5 through T7, and T9 through TK may be disabled. Signals output from the coefficient buffers 112 of the filter cells T1 through T3, T5 through T7, and T9 through TK may have a value of 0, and the multiplication signals M1 through M3, M5 through M7, and M9 through MK, output from the multipliers of the filter cells T1 through T3, T5 through T7, and T9 through TK, may be zero, for example, regardless of the type of data which may be stored in the data buffers 111.

The coefficient updating circuit 130 may estimate channels which may vary with respect to the input data signal DI and may generate the filtering coefficients C1 through CK based on the estimated channels. For example, the coefficient updating circuit 130 may generate the filtering coefficients C1 through CK such that the filtering coefficients C1 through CK may offset delayed signals input via multiple paths.

Figure 4:
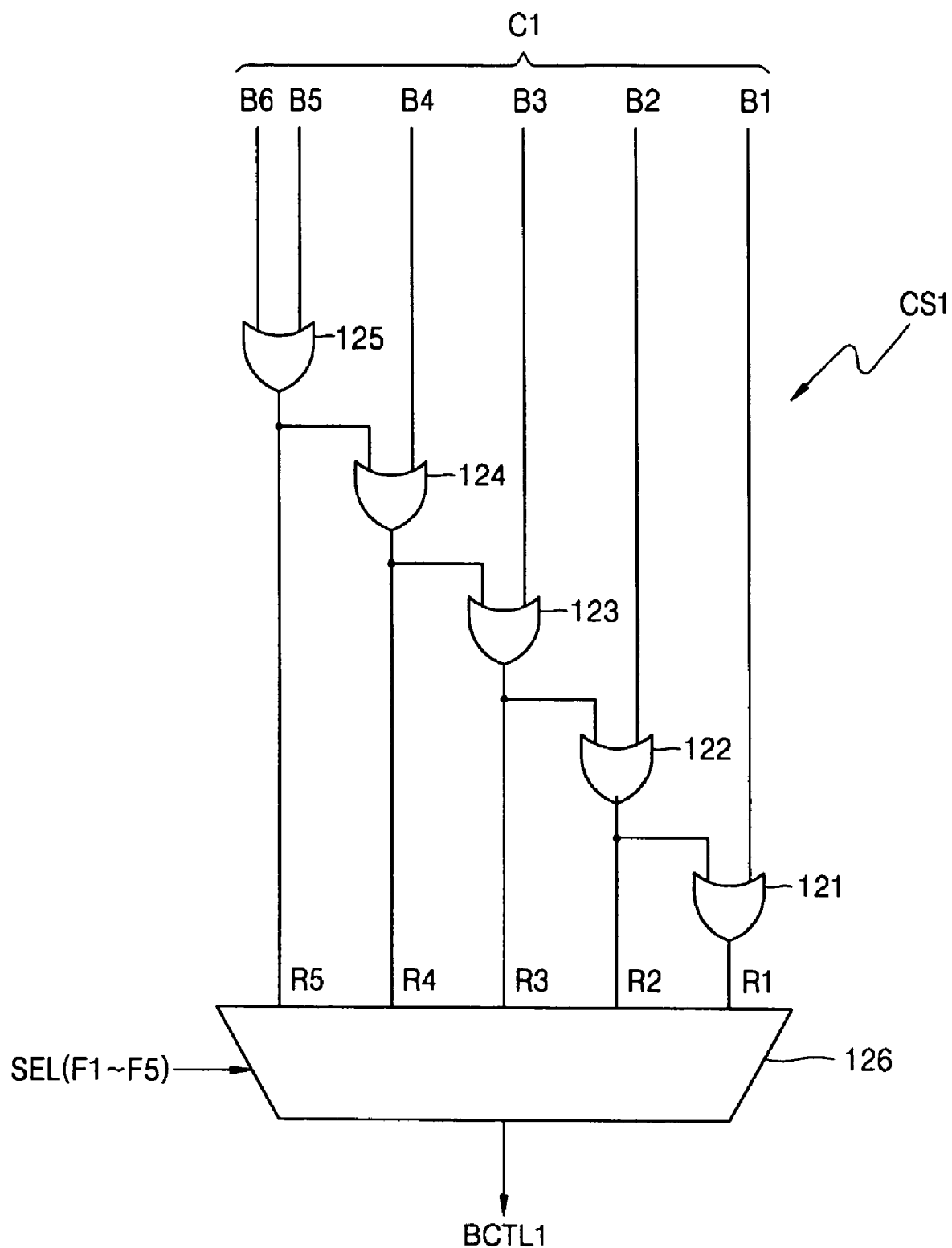
FIG. 4 is a detailed block diagram of a coefficient determination circuit, according to an example embodiment of the present invention.

FIG. 4 is a block diagram of a coefficient determination circuit according to an example embodiment of the present invention. The coefficient determination circuit CS1 will be described in detail below. Although only the coefficient determination circuit CS1 will be described herein in detail, it will be understood that the coefficient determination circuits CS1 through CSK may all have the same structure and/or operating characteristics.

Referring to FIG. 4, the coefficient determination circuit CS1 may include OR gates (or selectors) 121 through 125 and a multiplexer 126. The number of OR gates (or selectors) included in the coefficient determination circuit CS1 may increase or decrease, for example, according to the number of bits constituting the filtering coefficient C1. For example, if the filtering coefficient C1 has six bits, (e.g., B1 through B6), the OR gate 125 may perform an OR operation on the two most significant bits B6 and B5, and may output a logic signal R5. The OR gate 124 may perform an OR operation on the logic signal R5 and bit B4 and may output a logic signal R4. The OR gate 123 may perform an OR operation on the logic signal R4 and bit B3 and may output a logic signal R3. The OR gate 122 may perform an OR operation on the logic signal R3 and bit B2 and may output a logic signal R2. The OR gate 121 may perform an OR operation on the logic signal R2 and the least significant bit B1 and may output a logic signal R1. If at least one of the bits B6 and B5 has a higher logic value (e.g., a logic value of 'high' or '1'), the logic signal R5 may have a higher logic value (e.g., a logic value of 'high' or '1'). If at least one of the bits B6, B5, and B4 has a higher logic value (e.g., a logic value of 'high' or '1'), the logic signal R4 may have a higher logic value (e.g., a logic value of 'high' or '1'). If at least one of the bits B6, B5, B4, and B3 has a higher logic value (e.g., a logic value of 'high' or '1'), the logic signal R3 may have a higher logic value (e.g., a logic value of 'high' or '1'). If at least one of the bits B6, B5, B4, B3, and B2 has a higher logic value (e.g., a logic value of 'high' or '1'), the logic signal R2 may have a higher logic value (e.g., a logic value of 'high' or '1'). If at least one of the bits B6, B5, B4, B3, B2, and B1 has a higher logic value (e.g., a logic value of 'high' or '1'), the logic signal R1 may have a higher logic value (e.g., a logic value of 'high' or '1').

A bit selection signal SEL may include selection signals F1 through F5. One of the selection signals F1 through F5 may be enabled based on the threshold value. The threshold value may include one bit, which may be set to $2^T$ (where $0 \leq T \leq$ the number of logic signals−1). The threshold value may be, for example, one of 24, 23, 22, 21, and 20. If the threshold value is set to 24, the selection signal F5 may be enabled. If the threshold value is set to 23, the selection signal F4 may be enabled. If the threshold value is set to 22, the selection signal F4 may be enabled. If the threshold value is set to 21, the selection signal F2 may be enabled. If the threshold value is set to 20, the selection signal F1 may be enabled.

The multiplexer 126 may select one of the logic signals R1 through R5, for example, depending on which one of the selection signals F1 through F5 of the bit selection signal SEL may be enabled, and may output the selected logic signal as the filtering control signal BCTL1. For example, if the selection signal F5 is enabled, the multiplexer 126 may select and output the logic signal R5 as the filtering control signal BCTL1. If the selection signal F4 is enabled, the multiplexer 126 may select and output the logic signal R4 as the filtering control signal BCTL1. If the selection signal F3 is enabled, the multiplexer 126 may select and output the logic signal R3 as the filtering control signal BCTL1. If the selection signal F2 is enabled, the multiplexer 126 may select and output the logic signal R2 as the filtering control signal BCTL1. If the selection signal F1 is enabled, the multiplexer 126 may select and output the logic signal R1 as the filtering control signal BCTL1.

If the filtering coefficient C1 is, for example, "0011001" and the threshold is set to 24, the multiplexer 126 may select and output the logic signal R4, in response to the selection signal F4, as the filtering control signal BCTL1. Since the bits B6, B5, and B4 have a higher logic value (e.g., a logic value of 'high' or '1'), the logic signal R4 may also have a higher logic value (e.g., a logic value of 'high' or '1'), and the filtering control signal BCTL1 may be enabled. If the filtering coefficient C1 is, for example, "000111", the logic signal R4 may have a lower logic value (e.g., a logic value of 'low' or '0') because the bits B6, B5, and B4 may have a lower logic value (e.g., a logic value of 'low' or '0'), and the filtering control signal BCTL1 may be disabled. As described above, the coefficient determination circuit CS1 may perform an OR operation on the bits B6, B5, B4, B3, B2, and B1 of the filtering coefficient C1 and may determine whether the filtering coefficient C1 is less than the threshold value, for example, without the use of a comparator.

Figure 5:
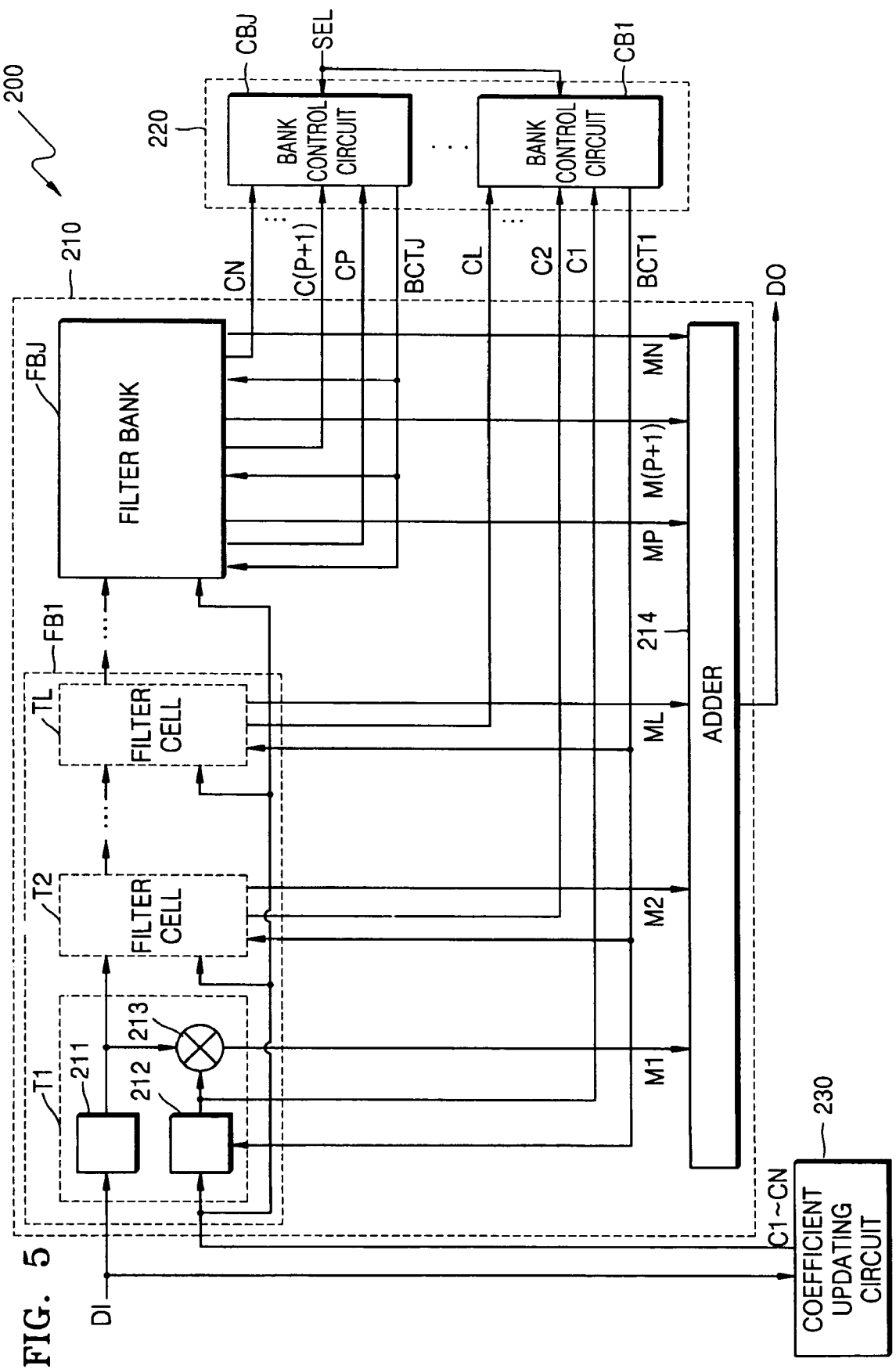
FIG. 5 is a block diagram of an equalizer according to another example embodiment of the present invention.

FIG. 5 is a block diagram of an equalizer 200 according to another example embodiment of the present invention. Referring to FIG. 5, the equalizer 200 may include a filtering circuit 210, a filter control circuit 220, and a coefficient updating circuit 230. The filtering circuit 210 may include a plurality of filter banks FB1 through FBJ (where J is an integer) and an adder 214. Each of the filter banks FB1 through FBJ may include a plurality of filter cells (e.g., taps) T1 through TL (where L is an integer). Each of the filter cells T1 through TL may include a data buffer 211, a coefficient buffer 212, and a multiplier 213. The filter cells T1 through TL, the adder 214, and the coefficient updating circuit 230 may have the same, or substantially the same, operating characteristics as the data buffer 111, the coefficient buffer 112 and the multiplier 113, of FIG. 3, and thus descriptions of the data buffer 211, a coefficient buffer 212, and a multiplier 213 will be omitted.

The coefficient buffers 212 of the filter bank FB1 may be enabled or disabled (e.g., simultaneously enabled or disabled) in response to a bank control signal BCT1. The coefficient buffers 212 of the filter banks FB1 through FBJ may be enabled or disabled (e.g., simultaneously enabled or disabled) in response to bank control signals BCT2 through BCTJ, respectively.

The filter control circuit 220 may include a plurality of bank control circuits CB1 through CBJ (where J is an integer). The bank control circuit CB1 may determine whether filtering coefficients C1 through CL, received from the coefficient buffers 212 of the filter bank CB1, are less than a threshold value and may output the bank control signal BCT1 based on the result. For example, if at least one of the filtering coefficients C1 through CL is larger than, or equal to, the threshold value, the bank control circuit CB1 may enable the bank control circuit BCT1. If all, or substantially all, of the filtering coefficients C1 through CL are less than the threshold value, the bank control circuit CB1 may disable the bank control signal BCT1. When the bank control signal BCT1 is enabled, all, or substantially all, of the coefficient buffers 212 of the filter bank FB1 may be enabled, and when the bank control signal BCT1 is disabled, all, or substantially all, of the coefficient buffers 212 of the filter bank FB1 may be disabled.

When all, or substantially all, of the coefficient buffers 212 of the filter bank FB1 are enabled, a filtering coefficient less than the threshold value may be stored in one or more of the coefficient buffers 212 of the filter bank FB1. For example, if main data stored in the data buffer 211 of the filter cell T2 is transferred to the data buffer 212 of the filter cell T3 and the coefficient buffer 212 of the filter cell T3 is disabled, the multiplier 213 of the filter cell T3 may output a multiplication signal M3 having a value of 0 even though the main data may be currently stored in the filter cell T3. If the main data is stored in at least one of the filter cells T1 through TL, all, or substantially all, of the data buffers 212 of the filter cells T1 through TL may be enabled. If the main data is not stored in any of the filter cells T1 through TL, all, or substantially all, of the data buffers of the filter cells T1 through TL may be disabled. The bank control circuits CB2 through CBJ may determine whether filtering coefficients received from the coefficient buffers 212 of the respective field banks FB2 through FBJ are less than the threshold value and may output the bank control signals BCT2 through BCTJ, respectively, based on the results.

Figure 6:
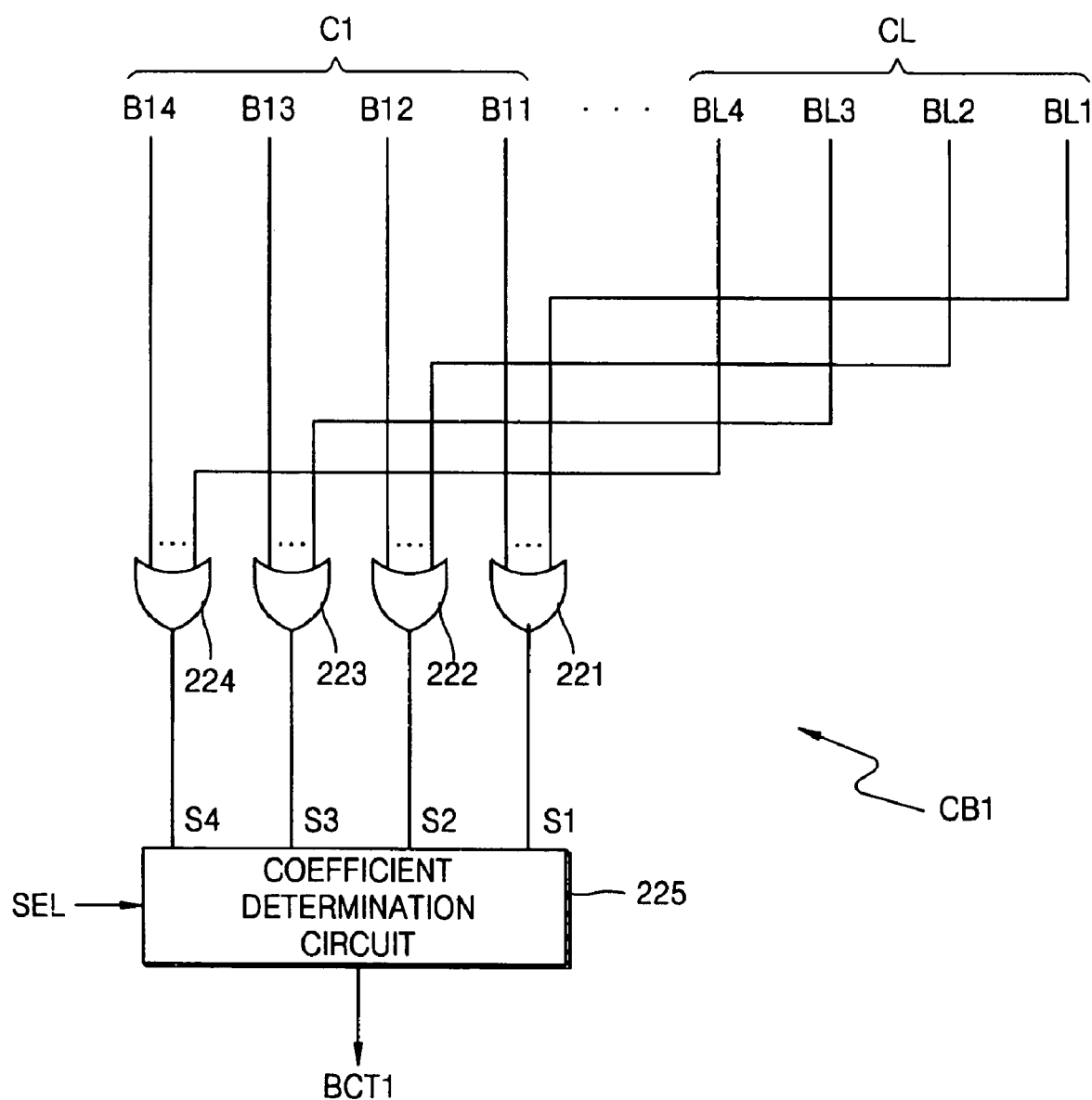
FIG. 6 is a block diagram of a bank control circuit, according to an example embodiment of the present invention.

FIG. 6 is a block diagram of a bank control circuit according to another example embodiment of the present invention. Since the bank control circuits CB1 through CBJ may have the same, or substantially the same, structure and/or operating characteristics, only the bank control circuit CB1 will be described in detail below.

Referring to FIG. 6, the bank control circuit CB1 may include pre-OR gates (or pre-selectors) 221 through 224 and a coefficient determination circuit 225. The number of pre-OR gates 221 included in the bank control circuit CB1 may increase or decrease according to the number of bits constituting each of the filtering coefficients C1 through CL. For example, if each of the filtering coefficients C1 through CL has four bits, the pre-OR gate 224 may perform an OR operation on the most significant bits B14, . . . , BL4, of the filtering coefficients C1 through CL and may output an operation signal S4. If at least one of the most significant bits B14, . . . , BL4 of the filtering coefficients C1 through CL has a higher logic value (e.g., has a logic value of 'high' or '1'), the pre-OR gate 224 may output an operation signal S4 having a higher logic value (e.g., has a logic value of 'high' or '1'). The pre-OR gate 223 may perform an OR operation on second most significant bits B13, . . . , BL3 of the filtering coefficients C1 through CL and may output an operation signal S3. If at least one of the second most significant bits B13, . . . , BL3 has a higher logic value (e.g., has a logic value of 'high' or '1'), the pre-OR gate 223 may output an operation signal S3 having a higher logic value (e.g., has a logic value of 'high' or '1'). The pre-OR gate 222 may perform an OR operation on second least significant bits B12, . . . , BL2 of the filtering coefficients C1 through CL and may output an operation signal S2. If at least one of the second least significant bits B12, . . . , BL2 has a higher logic value (e.g., has a logic value of 'high' or '1'), the pre-OR gate 222 may output an operation signal S2 having a higher logic value (e.g., has a logic value of 'high' or '1'). The pre-OR gate 221 may perform an OR operation on most significant bits B11, . . . , BL1 of the filtering coefficients C1 through CL and may output an operation signal S1. If at least one of the most significant bits B11, . . . , BL1 of the filtering coefficients C1 through CL has a higher logic value (e.g., has a logic value of 'high' or '1'), the pre-OR gate 221 may output an operation signal S1 having a higher logic value (e.g., has a logic value of 'high' or '1'). The coefficient determination circuit 225 may output the bank control signal BCT1 in response to a bit selection signal and the operation signals S1 through S4.

Figure 7:
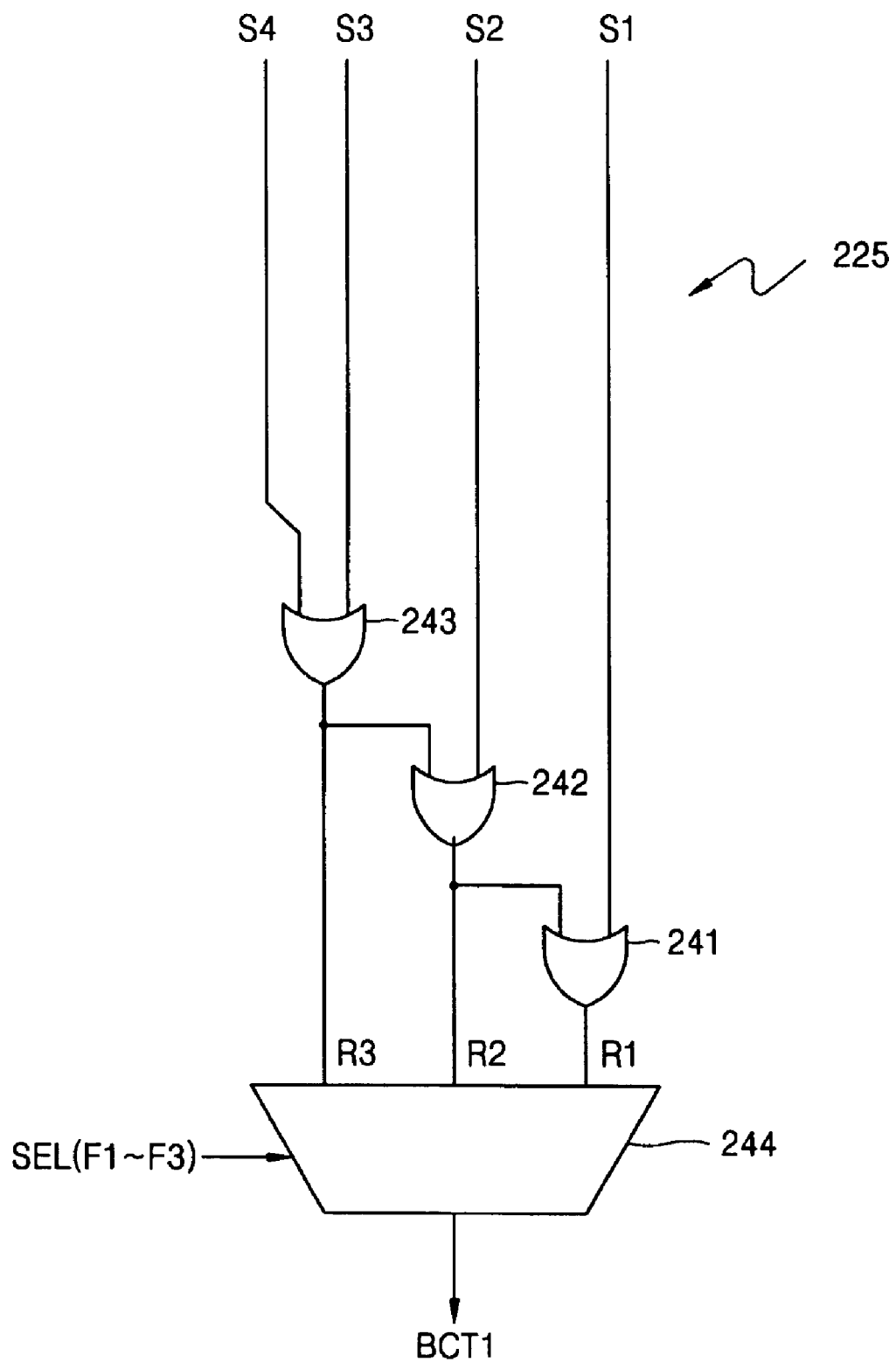
FIG. 7 is a detailed block diagram of a coefficient determination circuit, according to another example embodiment of the present invention.

FIG. 7 is a block diagram of the coefficient determination circuit according to another example embodiment of the present invention. Referring to FIG. 7, the coefficient determination circuit 225 may include OR gates 241 through 243 and a multiplexer 244. The number of OR gates included in the coefficient determination circuit 225 may increase or decrease according to the number of pre-OR gates included in the bank control circuit CB1. The number of pre-OR gates included in the bank control circuit CB1 may be determined based on the number of bits constituting each of the filtering coefficients C1 through CL. The number of OR gates included in the coefficient determination circuit 225 may also be determined depending on the number of bits constituting each of the filtering coefficients C1 through CL. The OR gates 241 through 243 and the multiplexer 244 may have the same, or substantially the same, operating characteristics as the OR gates 121-125 of FIG. 4, and thus their detailed descriptions will be omitted. As described above, the bank control circuits CB1 through CBJ may perform an OR operation on the filtering coefficients C1 through CL and may determine whether the filtering coefficients C1 through CL are less than the threshold value, for example, without the use of a comparator.

Although example embodiments of the present invention have been described with regard to a higher logic value (e.g., a logic value of 'high' or '1'), and a lower logic value (e.g., a logic value of 'low' or '0'), it will be understood that these values may be used interchangeably, and any suitable logic value may be used.

Although example embodiments of the present invention have been discussed with regard to, for example, four-bit filtering coefficients, it will be understood that any value described herein may be any suitable number of bits.

Although example embodiments of the present invention have been described with regard to OR logic operations, OR gates, pre-OR logic operations and/or pre-OR gates, it will be understood that any suitable selector and/or pre-selector (e.g., AND/pre-AND operations and/or gates, XOR/pre-XOR operations and/or gates, etc.) may be used.

As described above, an equalizer according to example embodiments of the present invention may determine whether filtering coefficients are less than a threshold value without the need for a comparator. Thus, the chip size of the equalizer according to the present invention may be reduced. In addition, an equalizer according to example embodiments of the present invention disable coefficient buffers storing filtering coefficients, which may be less than a threshold value, which may reduce filtered signal distortion.

While example embodiments of the present invention have been particularly shown and described with reference to example embodiments thereof, it will be understood by those of ordinary skill in the art that various changes in form and details may be made therein without departing from the spirit and scope of the present invention as defined by the following claims.

What is claimed is:

1. An equalizer comprising:
   a filtering circuit, which filters an input data signal based on a plurality of filtering coefficients, and outputs an output data signal;
   a filter control circuit, which determines whether the filtering coefficients satisfy a condition in response to a bit selection signal and outputs control signals based on the determination; and
   a coefficient updating circuit, which generates the filtering coefficients, estimates channels based on the input data signal and updates the filtering coefficients based on the estimated channels, wherein
   each of the filtering coefficients includes (I+1) bits where us an integer, the bit selection signal includes first through I-th selection signals, and one of the first through I-th selection signals is enabled based on a threshold value.

2. An equalizer comprising:
   a filtering circuit configured to filter an input data signal based on a plurality of filtering coefficients and control signals, and configured to output an output data signal;
   a filter control circuit configured to determine whether the filtering coefficients satisfy a condition in response to a bit selection signal, and configured to selectively enable or disable the control signals based on the determination; and
   a coefficient updating circuit configured to generate the filtering coefficients, estimate channels based on the input data signal and update the filtering coefficients based on the estimated channels.

3. The equalizer of claim 2, wherein the number of bits in each filtering coefficient is greater than the number of selection signals in the bit selection signal.

4. The equalizer of claim 2, wherein the filtering circuit further includes,
   a plurality of filter cells,
   wherein each of the filter cells includes a coefficient buffer configured to be enabled or disabled in response to one of the control signals, and configured to store one of the filtering coefficients when enabled.

5. The equalizer of claim 4,
   wherein the filter control, circuit includes a plurality of coefficient determination circuits, and
   wherein each of the coefficient determination circuits is configured to selectively enable or disable a corresponding control signal based on a comparison between filtering coefficients stored in a corresponding coefficient buffer and a threshold value.

6. The equalizer of claim 5, wherein each of the coefficient determination circuits further includes,
   first through I-th selectors, configured to output first through I-th logic signals, respectively, in response to the (I+1) bits of a corresponding filtering coefficient, and
   a multiplexer, configured to select one of the first through I-th logic signals in response to one of the first through I-th selection signals that is enabled and to output the selected logic signal as one of the control signals, wherein the first selector is configured to perform OR operation on the two most significant bits of the corresponding filtering coefficient and to output the first logic signal, and the I-th selector is configured to perform an OR operation on the least significant bit of the corresponding filtering coefficient and the (I−1)-th logic signal and to output the I-th logic signal.

7. The equalizer of claim 6, wherein the second through I-th selectors are configured to receive the first through (I−1)-th logic signals, respectively, via first input ports, and receive the (I+1) bits of the corresponding filtering coefficient excluding the two most significant bits via second input ports.

8. The equalizer of claim 4, wherein each of the coefficient buffers are configured to be selectively enabled when respective control signals are enabled, and are configured to be disabled when the respective control signals are disabled.

9. The equalizer of claim 4,
   wherein the filter control circuit further includes a plurality of coefficient determination circuits, and
   wherein each of the coefficient determination circuits is configured to perform a logic operation on at least one of (I+1) bits of at least one corresponding filtering coefficient stored in at least one corresponding coefficient buffer in response to at least one of a first through I-th selection signals and to output a logic operation result as a corresponding control signal.

10. The equalizer of claim 9, wherein the threshold value includes one bit which is set to $2^T$ where T=0, 1, ..., I−1, and wherein the equalizer is configured so that as the threshold value increases, the number of bits of each of the filtering coefficients that are subjected to the logic operation performed by each of the coefficient determination circuits decreases.

11. The equalizer of claim 9, wherein the equalizer is configured so that if the threshold value is at a maximum, the I-th selection signal is enabled, and each of the coefficient determination circuits performs the logic operation on the two most significant bits of the corresponding filtering coefficient in response to the I-th selection signal and outputs the logic operation result as the control signal.

12. The equalizer of claim 9, wherein the equalizer is configured so that if the threshold value is set to a minimum, the first selection signal is enabled, and each of the coefficient determination circuits performs the logic operation on all of the I+1 bits of the corresponding filtering coefficient in response to the first selection signal and outputs the logic operation result as the corresponding control signal.

13. The equalizer of claim 9, wherein, the logic operation is an OR operation.

14. The equalizer of claim 2, wherein,
   the filtering circuit includes a plurality of filter banks, and each of the plurality of filter banks further includes a plurality of filter cells,
   the filter cells further include a coefficient buffer configured to be enabled or disabled in response to one of the plurality of control signals, and to store one of the filtering coefficients when enabled, and
   the coefficient buffers of the filter cells of each of the filter banks are configured to be enabled or disabled In response to one of the control signals.

15. The equalizer of claim 14, wherein the filter control circuit further includes a plurality of bank control circuits, wherein each of the bank control circuits is configured to selectively enable or disable a corresponding control signal based on a comparison between at least one of the filtering coefficients stored in the coefficient buffers of a corresponding filter bank and a threshold value.

16. The equalizer of claim 15, wherein each of the bank control circuits includes,
   pre-selectors configured to output first through (I+1)-th operation signals in response to the (I+1) bits of each of the filtering coefficients received from a corresponding filter bank, and
   a coefficient determination circuit configured to generate a corresponding control signal in response to a bit selection signal and the first through (I+1)-th operation signals.

17. The equalizer of claim 16, wherein each of the pre-selectors is configured to perform an OR operation on one of the (I+1) bits of each of the filtering coefficients received from a corresponding filter bank.

18. The equalizer of claim 16, wherein the coefficient determination circuit includes,
   first through I-th selectors configured to output first through I-th logic signals, respectively, in response to the first through (I+1)-th operation signals; and
   a multiplexer configured to select one of the first through I-th logic signals in response to one of the first through I-th selection signals that is enabled, and to output the selected logic signal as the corresponding bank control signal,
   wherein the first selector is configured to perform an OR operation on the first and second operation signals and output the first logic signal, and the I-th selector is configured to perform an OR operation on the (I+1)-th operation signal and the (I−1)-th logic signal and output the I-th logic signal.

19. The equalizer of claim 18, wherein the second through I-th selectors are configured to receive the first through (I−1)-th logic signals via first input ports, and receive the third through (I+1)-th operation signals via second input ports.

20. The equalizer of claim 14, wherein each of the coefficient buffer's is configured to be selectively enabled when respective control signals are enabled, and disabled when the respective control signals are disabled.

21. The equalizer of claim 14, wherein the filter control circuit further includes a plurality of filter banks and a plurality of bank control circuits, and each of the bank control circuits is configured to perform a logic operation on at least one of the (I+1) bits of each of the corresponding filtering coefficients respectively stored in the coefficient buffers of a corresponding filter bank, and output the logic operation results as a corresponding control signal.

22. The equalizer of claim 21, wherein the equalizer is configured so that the threshold value includes one bit which is set to $2^T$ where T=0, 1, ..., I−1, and as the threshold value increases, the number of bits of each of the filtering coefficients that are subjected to the logic operation performed by each of the coefficient determination circuits decreases.

23. The equalizer of claim 21, wherein the equalizer is configured so that if the threshold value is set to a maximum, only the I-th selection signal is enabled, and each of the bank control circuits performs the logic operation on the two most significant bits of each of the filtering coefficients, received from the corresponding filter bank, in response to the I-th selection signal, and outputs the logic operation results as the corresponding control signal.

24. The equalizer of claim 21, wherein the equalizer is configured so that if the threshold value Is set to a minimum, only the first selection signal is enabled, and each of the coefficient determination circuits performs the logic operation on the (I+1) bits of each of the filtering coefficients, received from the corresponding filter bank, in response to the first selection signal, and outputs the logic operation results as a corresponding control signal.

25. The equalizer of claim 21, wherein the logic operation is an OR operation.

26. A filter control circuit comprising:
a plurality of coefficient determination circuits, wherein each of the coefficient determination circuits is configured to selectively enable or disable a corresponding control signal based on a comparison between filtering coefficients stored in a corresponding coefficient buffer and a threshold value.

27. A channel equalizing method for a filtering circuit, the method comprising:
filtering an input data signal based on a plurality of filtering coefficients and control signals to generate an output data signal;
outputting the output data signal;
determining whether the filtering coefficients satisfy a condition in response to a bit selection signal;
selectively enabling or disabling the control signals based on the determination;
generating the filtering coefficients;
estimating channels based on the input data signal; and
updating the filtering coefficients based on the estimated channels.

28. An equalizer including the filter control circuit of claim 26.

29. An equalizer configured to perform the channel equalizing method of claim 27.

* * * * *